(12) United States Patent
Ritchie

(10) Patent No.: US 6,621,344 B2
(45) Date of Patent: Sep. 16, 2003

(54) VARIABLE GAIN AMPLIFIER STAGE

(75) Inventor: Charles Graeme Ritchie, Ipswich (GB)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/102,971

(22) Filed: Mar. 22, 2002

(65) Prior Publication Data
US 2002/0171489 A1 Nov. 21, 2002

(30) Foreign Application Priority Data
May 21, 2001 (EP) ............................................ 01304466

(51) Int. Cl.[7] ................................................. H03F 3/45
(52) U.S. Cl. ....................................... 330/254; 330/261
(58) Field of Search ................................ 330/252, 253, 330/254, 261, 300

(56) References Cited

U.S. PATENT DOCUMENTS

| 3,491,306 A | | 1/1970 | Nielsen ........................ 330/29 |
| 5,399,990 A | * | 3/1995 | Miyake ....................... 330/254 |
| 5,550,513 A | | 8/1996 | Wong ......................... 330/286 |

OTHER PUBLICATIONS

Japanese Patent Abstract No. 2000307364, filed Nov. 2, 2000.
Japanese Patent Abstract No. 10198910, filed Jul. 31, 1998.

* cited by examiner

Primary Examiner—Steven J. Mottola

(57) ABSTRACT

A variable gain amplifier stage has first and second input terminals for receiving a differential input signal and first and second emitter follower transistors having their base electrodes coupled to the input terminals and their emitter electrodes coupled to a pair of matched voltage controlled current sources. A differential pair of transistors has their base electrodes coupled to the emitter electrodes of the first and second emitter follower transistors and their emitter electrodes coupled together and to a third voltage controlled current source. The voltage controlled current sources are controlled by the same voltage source so that a decrease in the differential pair tail current increases the bandwidth and decreases the gain of the stage, but a decrease in the current through the emitter follower transistors decreases the bandwidth of the stage so that by carefully controlling the relationship between these currents, a constant bandwidth can be maintained.

11 Claims, 2 Drawing Sheets

VARIABLE GAIN AMPLIFIER STAGE

FIELD OF THE INVENTION

This invention relates, in general, to a variable gain amplifier stage and more particularly to a variable gain amplifier stage that has a constant bandwidth.

BACKGROUND OF THE INVENTION

In general, the product of the gain of an amplifier stage and the bandwidth of the gain stage is fixed. Thus, if the gain stage has a variable gain, the bandwidth will vary inversely proportionately to the gain, so that, if the gain is increased, the bandwidth decreases and if the gain is decreased, the bandwidth increases. However, this increase in bandwidth is usually the result of a resonant peak in the frequency response of the amplifier stage.

Therefore, it is desirable to provide an amplifier stage that maintains a constant bandwidth over a wide range of gain settings, so that high signal quality can be maintained over a wide dynamic range.

BRIEF SUMMARY OF THE INVENTION

Accordingly, in a first aspect, the present invention provides a variable gain amplifier stage comprising first and second input terminals for receiving a differential input signal, first and second input transistors, the first input transistor having a base electrode coupled to the first input terminal, a first current electrode coupled to a first supply rail and a second current electrode coupled to a first voltage controlled current source, and the second input transistor having a base electrode coupled to the second input terminal, a first current electrode coupled to the first supply rail and a second current electrode coupled to a second voltage controlled current source, a differential pair of transistors having respective base electrodes coupled to the second current electrodes of the first and second transistors, respectively, first current electrodes coupled to the first supply rail via load components and second current electrodes coupled together and to a third voltage controlled current source, wherein the gains of the first and second voltage controlled current sources are matched, and first and second output terminals coupled respectively to the respective first current electrodes of the differential pair of transistors.

BRIEF DESCRIPTION OF THE DRAWINGS

An embodiment of the present invention will now be described, by way of example, with reference to FIG. 1 of the accompanying drawing, which is a schematic circuit diagram of an embodiment of a variable gain amplifier stage according to one embodiment of the present invention including bipolar transistors.

DETAILED DESCRIPTION OF THE DRAWING

Figure 1:
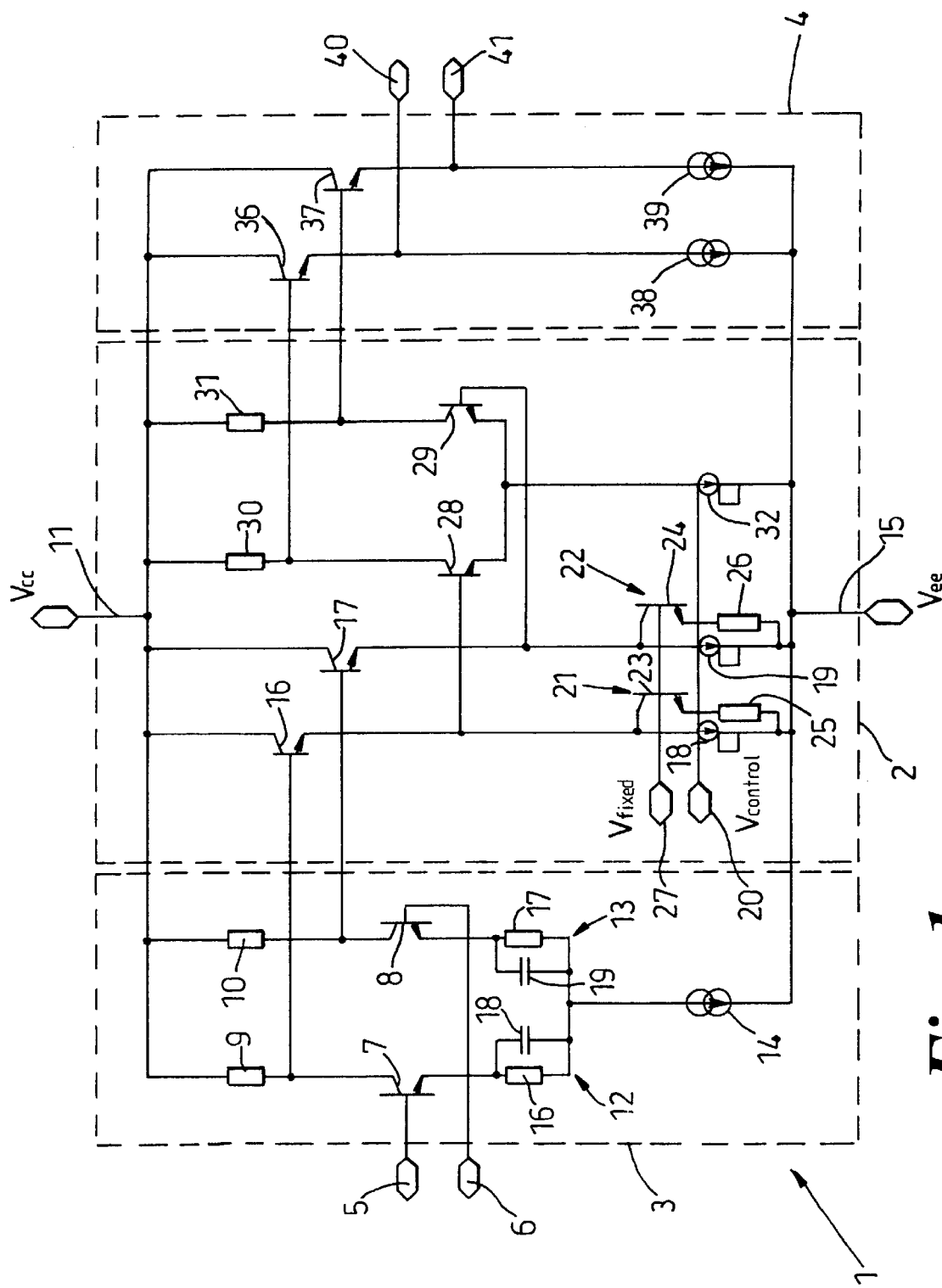

Thus, as shown in the drawing, a variable gain amplifier stage 1 includes a fixed bandwidth gain stage 2, an optional pre-emphasis gain stage 3 and an optional output buffer stage 4. The pre-emphasis gain stage 3 includes a pair of differential input terminals 5 and 6 coupled to respective base electrodes of a differential pair of bipolar transistors 7 and 8. Respective collector electrodes of the differential pair of transistors 7 and 8 are coupled, via respective resistors 9 and 10, to a power supply rail 11 operating at $V_{cc}$. Respective emitter electrodes of the differential pair of transistors 7 and 8 are coupled, via respective RC filters 12 and 13, to a single current source 14, which is coupled to a relative ground power supply rail 15 operating at $V_{ee}$. Each of the RC filters 12 and 13 comprises a resistor 56, 57 and a capacitor 18, 19 coupled in parallel between the respective emitter electrode of the respective transistor 7, 8 and the current source 14. The values of the resistors and the capacitors in the RC filters 12 and 13 are chosen so as to provide pre-emphasis filtering of an input signal to provide a peak in frequency response at high frequencies.

A differential output is taken from the respective collector electrodes of the differential pair of transistors 7 and 8 and provided as a differential input to respective base electrodes of a pair of emitter follower bipolar transistors 16 and 17 forming input transistors of the fixed bandwidth gain stage 2. Respective collector electrodes of the input transistors 16 and 17 are coupled to the power supply rail 11 and respective emitter electrodes of the input transistors 16 and 17 are coupled, via respective voltage controlled current sourcesss 18 and 19, to the relative ground power supply rail 15. Each of the voltage controlled current sources 18 and 19 is coupled to a control voltage terminal 20 providing a controllable voltage $V_{control}$ to control the gain of the voltage controlled current sources 18 and 19. The gains of the two voltage controlled current sources 18 and 19 are matched.

Respective DC current sinks 21 and 22 are coupled in parallel with respective ones of the two voltage controlled current sources 18 and 19. Each of the DC current sinks 21 and 22 includes a transistor 23, 24 coupled in series with a resistor 25, 26 such that the collector electrode of the transistor is coupled to the emitter electrode of the respective one of input transistors 16 and 17, the emitter electrode of the transistor is coupled to a first electrode of the respective resistor 25, 26, and the base electrode of the transistor is coupled to a fixed voltage terminal 27 providing a fixed voltage $V_{fixed}$ to control the DC level of the DC current sinks 21 and 22, with the second electrode of the resistor being coupled to the relative ground power supply rail 15. The DC current sinks are used to adjust the current through the input transistors 16 and 17 to maximise the switching speed of the transistors since the switching speed is dependent on the current through a transistor.

Respective emitter electrodes of the input transistors 16 and 17 are also coupled, to provide an amplified differential signal to, respective base electrodes of a differential pair of transistors 28 and 29. Respective collector electrodes of the differential pair of transistors 28 and 29 are coupled to the power supply rail 11 via respective resistors 30 and 31 and respective emitter electrodes of the differential pair of transistors 28 and 29 are coupled together and, via a voltage controlled current source 32, to the relative ground power supply rail 15. The voltage controlled current source 32 is coupled to the control voltage terminal 20 so that the controllable voltage $V_{control}$ controls the gain of the voltage controlled current source 32. However, in this case, the gain of the voltage controlled current source 32 is predetermined so that the ratio of the gains of the voltage controlled current sources 18 and 32 maintains a flat frequency response of the stage 2.

Thus, it will be seen that since the voltage controlled current sources 18, 19 and 32 are controlled by the same voltage source $V_{control}$, a decrease in the differential pair tail current, will increase the bandwidth and decrease the gain of the stage, but a decrease in the current through the emitter follower transistors will decrease the bandwidth of the stage.

Therefore, by carefully controlling the ratio of the gains between the voltage controlled current sources 18 and 19, on the one hand, and voltage controlled current source 32, on the other, a constant bandwidth can be maintained.

The output buffer stage 4 includes a pair of emitter follower transistors 36 and 37. A differential output is taken from the respective collector electrodes of the differential pair of transistors 28 and 29 and provided as a differential input to respective base electrodes of the pair of emitter follower transistors 36 and 37. Respective collector electrodes of the emitter follower transistors 36 and 37 are coupled to the power supply rail 11 and respective emitter electrodes of the emitter follower transistors 36 and 37 are coupled, via respective current sources 38 and 39, to the relative ground power supply rail 15. A differential output is taken from the respective emitter electrodes of the emitter follower transistors 36 and 37 and coupled to a pair of differential output terminals 40 and 41 to provide the differential output of the variable gain amplifier stage.

Figure 2:
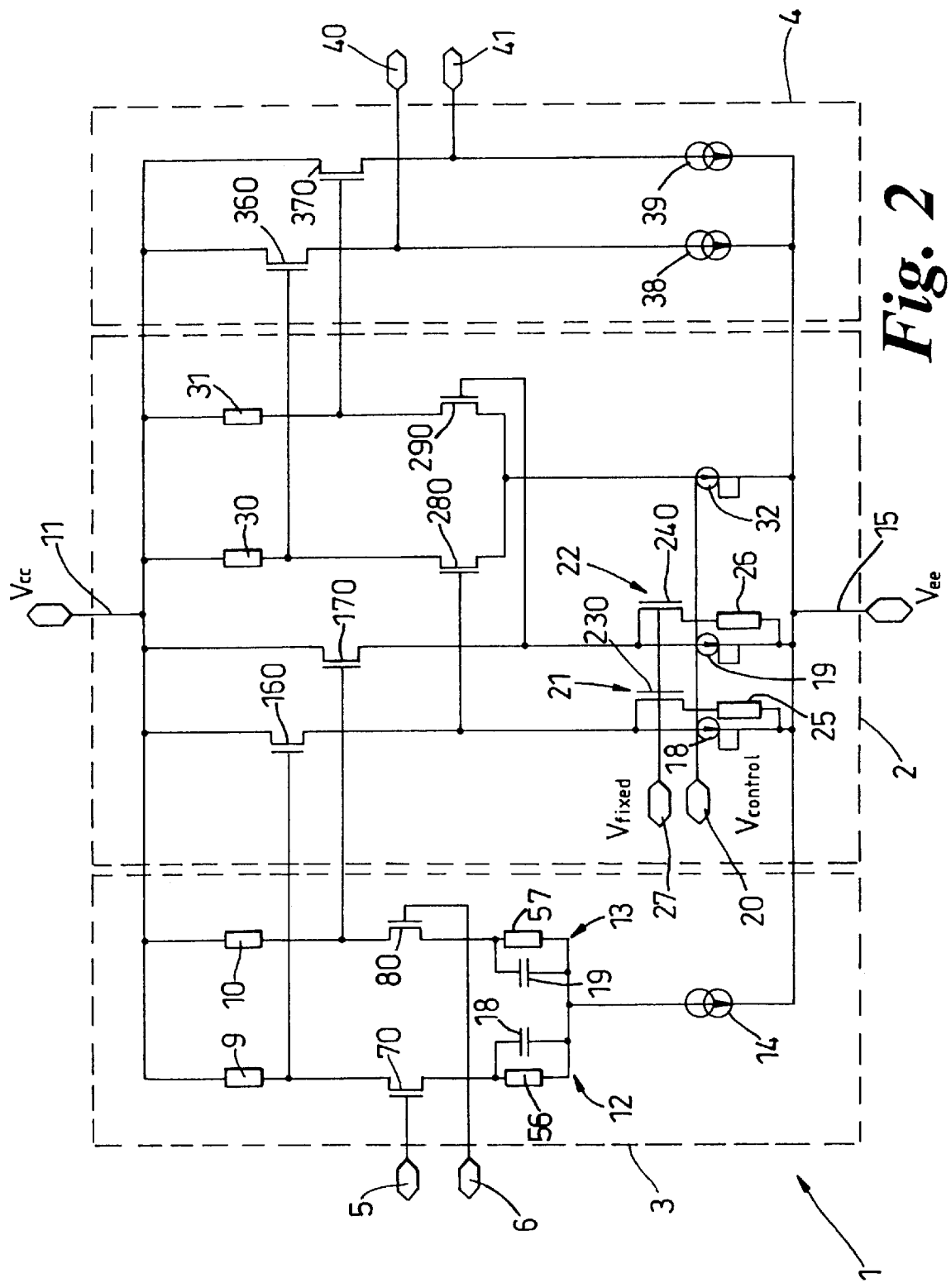
FIG. 2 is a schematic circuit diagram of a second embodiment employing field effect transistors.

It will be appreciated that the above description has been given by way of example only and that a person skilled in the cart can make varios modifications and improvements without departing from the scope of the present inivention. For example, although the various transistors, particularly the transistors forming the DC current sinks, have been shown as bipolar transistors, it will be appreciated that they could alternatively be formed as Metal Oxide Semiconductor Field Effect Transistors (MOSFETS) without departing from the scope of the present invention. For example, biopolar transistors 7, 8, 16, 17, 21, 22, 28, 29, 36 and 37 of FIG. 1 are respectively replaced in FIG. 2 by field effect transistors 70, 80, 160, 170, 210, 220, 280, 290, 360 and 370.

What is claimed is:

1. A variable gain amplifier stage comprising:

first and second input terminals for receiving a differential input signal;

first and second input transistors, the first input transistor having a control electrode coupled to the first input terminal, a first current electrode coupled to a first supply rail and a second current electrode coupled to a first voltage controlled source, and the second input transistor having a control electrode coupled to the second input terminal, a first current electrode coupled to the first supply rail and a second current electrode coupled to a second voltage controlled current source;

a differential pair of transistors having respective control electrodes coupled to the second current electrodes of the first and second input transistors, respectively, first current electrodes coupled to the first supply rail via load components and second current electrodes coupled together and to a third voltage voltage controlled current source, wherein the output currents of the first and second voltage controlled current sources are arranged to be matched; and first and second output terminals coupled respectively to the respective first current electrodes of the differential pair of transistors.

2. A variable gain amplifier stage according to claim 1, wherein a ratio of the gains of the first and third voltage controlled current sources are predetermined to provide a flat frequency response.

3. A variable gain amplifier stage according to claim 1 wherein the first, second and third voltage controlled current sources are all coupled to a variable voltage source that can be varied to control the gains of the voltage controlled current sources.

4. A variable gain amplifier stage according to claim 1, further comprising first and second DC current sources coupled in parallel with the respective first and second voltage controlled current sources.

5. A variable gain amplifier stage according to claim 4, wherein at least one of said first and second DC current sources comprises a transistor and a resistor, a control electrode of the transistor being coupled to a predetermined voltage source.

6. A variable gain amplifier stage according to claim 5, wherein the transistor of the DC current source comprises a Field Effect Transistor (FET).

7. A variable gain amplifier stage according to claim 6, wherein the transistor of the DC current source comprises a Metal Oxide Semiconductor Field Effect Transistor (MOSFET).

8. A variable gain amplifier stage according claim 1, further comprising a pre-emphasis gain stage coupled between said first and second input terminals and said base electrodes of said first and second input transistors.

9. A variable gain amplifier stage according to claim 8, wherein said pre-emphasis gain stage comprises a differential pair of transistors having respective control electrodes coupled to the first and second input terminals, respectively, first current electrodes coupled to the first supply rail and second current electrodes coupled together via a pair of respective RC filter elements.

10. A variable gain amplifier stage according to claim 1, further comprising an output buffer stage coupled between said first and second output terminals and said first current electrodes of said differential pair of transistors.

11. A variable gain amplifier stage according to claim 10, wherein said output buffer stage comprises a pair of transistors having respective base electrodes coupled to said first current electrodes of said differential pair of transistors, first current electrodes coupled to the first supply rail, and second current electrodes coupled to a respective one of a pair of current sources, said first and second output terminals being coupled to the respective second current electrodes of the pair of transistors.

* * * * *